(12) United States Patent
Milanesi et al.

(10) Patent No.: US 6,292,341 B1
(45) Date of Patent: Sep. 18, 2001

(54) BIDIRECTIONAL ELECTRONIC SWITCH

(75) Inventors: Andrea Milanesi, Castelnoceto; Stefania Chicca, Vecchiano; Marco Morelli, Milan; Vanni Poletto, Casale Monferrato, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/295,842

(22) Filed: Apr. 21, 1999

(30) Foreign Application Priority Data

Apr. 27, 1998 (EP) .................................................. 98830252

(51) Int. Cl.⁷ ...................................................... H02H 3/18
(52) U.S. Cl. .......................... 361/79; 361/91.1; 361/93.9; 361/100
(58) Field of Search ................................ 361/42, 45, 78, 361/79, 86, 87, 54, 91.5, 88, 91.1, 93.1, 93.9, 100, 101

(56) References Cited

U.S. PATENT DOCUMENTS

| 4,787,007 | * | 11/1988 | Matsumura et al. | 361/98 |
| 4,918,564 | * | 4/1990 | Walker et al. | 361/94 |
| 5,245,526 | * | 9/1993 | Balakrishnan et al. | 363/97 |
| 5,311,138 | * | 5/1994 | Ott et al. | 324/503 |
| 5,789,968 | * | 8/1998 | John | 327/436 |

FOREIGN PATENT DOCUMENTS

| 0 556 663 A1 | 2/1993 | (EP) | G05F/1/565 |
| 91 16637 | 10/1991 | (WO) | G01R/31/00 |

* cited by examiner

*Primary Examiner*—Kim Huynh
(74) *Attorney, Agent, or Firm*—Theodore E. Galanthay; Allen, Dyer, Doppelt, Milbrath & Gilchrist, P.A.

(57) ABSTRACT

A protection circuit of a diagnostic output line (K-line) of a control unit for protection of the control unit in the event of a ground disconnection or of a "below ground" condition is provided. The diagnostic output line includes a first interface DMOS transistor with a source connected to ground and a drain coupled to the diagnostic output line through a second DMOS transistor with a source connected to the output line and a drain connected to the source of the first DMOS transistor. The protection circuit also includes a comparator for the voltage of the diagnostic output line with the potential of the ground node, and a two-input logic gate, whose output controls a current generator forcing a current, limited by a resistor, on the diagnostic output line.

25 Claims, 3 Drawing Sheets

BIDIRECTIONAL ELECTRONIC SWITCH

FIELD OF THE INVENTION

The present invention relates to electronics, and more particularly to the protection of devices and circuits of electronic control units from accidental current overloads.

BACKGROUND OF THE INVENTION

The use of central processing units (CPU) for controlling industrial processing equipment has become increasingly widespread. CPUs provide control in a more precise manner than possible with traditional automatic, mechanical and/or electromechanical controllers. These electronic control units generally also provide for a diagnostic interface of the operating conditions of the motor or of the device being controlled. These diagnostic functions require the presence of dedicated diagnostic output lines, to which may be coupled a suitable electronic testing apparatus.

A typical example of these types of applications is the electronic control unit of the engine of a car or of similar means of transportation. Thus, the ensuing description refers to a generic motor'electronic control unit (ECU) having one or more diagnostic output lines (K-lines) through which a tester may be coupled. These diagnostic lines may be useful to detect malfunctions and/or exploited to activate an alarm or antitheft system, such as, for example, a motor vehicle "immobilizer".

A typical application scheme is shown in FIG. 1. The engine's control unit, or simply the ECU, may be represented by a resistive load $R_{load}$ (current being absorbed by the control unit) and by a capacitive load $C_{load}$ (electrolytic capacitors of large value usually connected in parallel to the control unit). The diagnostic output interface is a K-line that may be represented by an interfacing DMOS transistor MI for motor vehicles. The characteristics of these diagnostic interfaces are defined by the standard ISO 9141. The tester is generally represented by an electrical model composed of a mechanical switch and a pull-up resistance Rp, as in FIG. 1.

A serious problem arises if the ECU is accidentally disconnected from ground, due to a false contact or to any other cause. In this case, the only point at that instant that may be coupled to ground is the K-line output, through the switch (tester). An undue flow of the current absorbed by the ECU through such an output line must be averted in order to avoid damage to the interface device MI.

A simple approach to this problem is to place a diode in series to the K-line output, as illustrated in FIG. 2. If, by any cause, a ground disconnection occurs, the diode is reverse biased so that the current cannot flow and thus the ECU is protected. The drawback of this known approach is the voltage drop on the guard diode which may reach about 1V during normal functioning conditions. Therefore the minimum voltage at the output of the diagnostic line K-line becomes: Vdiode+Vdmos. Under certain circumstances, this condition may jeopardize a correct recognition of a logic zero.

Another known approach is depicted in FIG. 3. In this case, the diode is substituted by a guard DMOS transistor MP, the source of which is connected to the K-line output and the drain to the interface DMOS transistor MI that is used for communicating through the K-line. During normal operating conditions, the second guard DMOS transistor MP is turned on with a gate voltage, which in the illustrated example, is equal to R*I, through the comparator COMP of the output voltage VOUT, the logic AND gate A1, the controlled current generator I and the resistor R. The output voltage drop does not increase if the areas of the two power transistors MI and MP are properly dimensioned.

Should a below ground potential (negative potential) or a ground disconnection occur during normal functioning, the comparator COMP turns off the current generator I. The voltage present on the gate of the DMOS transistor MP decreases with a time constant $\tau = RC_{par,DMOS}$, turning it off and impeding the passage of an inverse current through the interface DMOS transistor MI. In order to attain a low conduction resistance $R_{on}$, the two DMOS transistors should have a large area of integration, but this implies relatively large parasitic capacitances ($C_{par,Mos}$), on the order of tens of pF. By hypothesizing a parasitic capacitance of 100 pF, with R=10 KΩ, the time constant will be $\tau = 1$ $\mu$S. The complete switch-off of the DMOS transistor MP could occur after approximately 1.5τ. During this interval, a large inverse current that may be of several amperes, flows through the DMOS transistor MP. This current is large because of a relatively low $R_{load}$ and because of a large $C_{load}$ that contributes to lower the impedance during the transients.

An approach to the problem could be reducing he resistance as much as possible, but this would markedly increase the bias current of the circuit that, in modern applications, is required to be lower and lower.

The following condition may also occur during normal functioning. The standard ISO 9141 considers that the diagnostic line K-line output may drop to -1V, as compared to the ground potential of the circuit.

During the switch-off transient, a portion of the inverse current comes from the substrate of the DMOS transistor MI, through the parasitic diode $D_{par}$. It is important to limit this current in order to prevent problems in other areas of the integrated circuit that may be caused by substrate currents.

SUMMARY OF THE INVENTION

An efficient approach to the above cited problems and limitations of known circuits has been found. The invention achieves an almost complete elimination of the inverse current during the transient of a below ground occurrence or an accidental ground disconnection, while minimizing the bias current of the protection or guard circuit at the same time.

According to this invention, these benefits and advantages are attained by using an additional MOS transistor for switching off a second DMOS guard transistor, during a below ground condition. This allows a time constant of two orders of magnitude lower than that possible with the known circuits where the time constant is relatively high because of a value of the resistance R that cannot be lowered below a certain limit for other reasons.

The invention is directed to a protection circuit of a diagnostic output line (K-line) of a control unit for protection of the control unit in the event of a disconnection of the control unit circuits from ground or of a below ground condition. The diagnostic output line comprises a first interface DMOS transistor with a source connected to ground and a drain coupled to the diagnostic output line through a second DMOS transistor with a source connected to the diagnostic output line and a drain connected to the source of the first DMOS transistor.

Also, the protection circuit includes a comparator for the voltage of the diagnostic output line with the potential of the ground node of the circuits of the control unit, a two-input logic gate, having a first input connected to the output of the comparator and a second input coupled to the gate of the first DMOS transistor, whose output controls a current generator forcing a current, limited by a resistor, on the diagnostic output line. The gate of the second DMOS transistor is coupled to the connection node between the controlled current generator and the limiting resistor.

Furthermore, the protection circuit comprises a third MOS transistor for switching off the second DMOS transistor, functionally coupled in parallel to the resistor and controlled by a line comprising a second current generator controlled through an inverter by the output of the comparator and forcing a current through a voltage divider on the diagnostic output line. The intermediate node of the voltage divider is coupled to a gate of the third MOS transistor, and a third current generator is connected between the gate node of the third transistor and ground. The third MOS transistor is controlled by the output of the comparator in phase with the first current generator and in opposite phase from the second current generator.

The protection circuit may also include the limiting resistor and the branch resistor of the voltage divider between the diagnostic output line and the intermediate node being functionally substituted by respective Zener diodes.

DETAILED DESCRIPTION OF THE PREFERRED EMBODIMENTS

Figure 4:
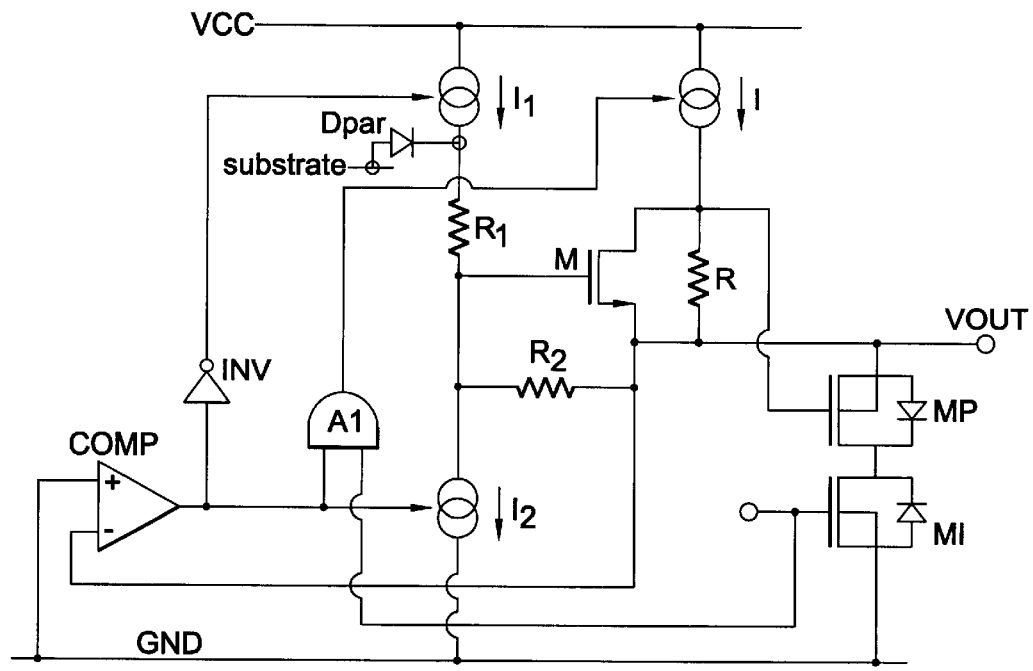
FIG. 4 is a basic scheme of the protection circuit of the invention.

FIG. 4 illustrates a protection circuit of a diagnostic output line (K-line) of a control unit (ECU) for protection of the control unit in the event of a disconnection of the control unit circuits from ground GND or of a below ground condition. The diagnostic output line (K-line) includes a first interface DMOS transistor MI with a source connected to ground and a drain coupled to the diagnostic output lines VOUT through a second DMOS transistor MP which in turn, includes a source connected to the diagnostic output line VOUT and a drain connected to the source of the first DMOS transistor MI.

Also, the protection circuit includes a comparator COMP for comparing the voltage VOUT of the diagnostic output line with the potential of the ground node GND of the circuits of the control unit, and a two-input logic AND gate A1, having a first input connected to the output of the comparator COMP and a second input coupled to the gate of the first DMOS transistor MI, whose output controls a current generator I forcing a current, limited by a resistor R, on the diagnostic output line VOUT. The gate of the second DMOS transistor MP is coupled to the connection node between the controlled current generator I and the limiting resistor R.

Furthermore, the protection circuit includes a third MOS transistor M for switching off the second DMOS transistor MP, functionally coupled in parallel to the resistor R and controlled by a line having a second current generator $I_1$ controlled through an inverter INV by the output of the comparator COMP and forcing a current through a voltage divider $R_1$, $R_2$ on the diagnostic output line VOUT. The intermediate node of the voltage divider is coupled to a gate of the third MOS transistor M, and a third current generator $I_2$ is connected between the gate node of the third transistor M and ground. The third MOS transistor M is controlled by the output of the comparator COMP in phase with the first current generator I and in opposite phase from the second current generator $I_1$.

By referring to the basic scheme of FIG. 4, a condition of below ground potential of the semiconductor substrate of the devices that form a diagnostic interface is detected by the comparator COMP which, through a logic AND gate A1, switches off the current generator I. Simultaneously, the current generator $I_2$ that maintains the MOS transistor M in a state of high impedance during the normal functioning of the control unit is also switched off, while through the inverter Inv the current generator $I_1$ is switched on for immediately switching on the MOS transistor M.

The circuit functions perfectly even during an accidental ground disconnection that may occur while the current path through the external tester's switch is closed and the capacitances, electronically in parallel to the ECU control unit, supply the circuits for a non-negligible time. If a ground disconnection occurs, the MOS transistor M is positively switched on even if the load capacitance $C_{load}$ is completely discharged. In this case, the ground node GND of the control unit is at the voltage of the powering battery voltage and the circuit is unpowered. The parasitic diode $D_{par}$, schematically indicated in FIGS. 4 and 5, keeps the resistor $R_1$ connected to the semiconductor substrate. Therefore, the MOS transistor M is activated by virtue of the voltage drop on the resistance $R_2$, which together with $R_1$ define a voltage divider between the substrate and the output node VOUT of the diagnostic line.

Figure 5:
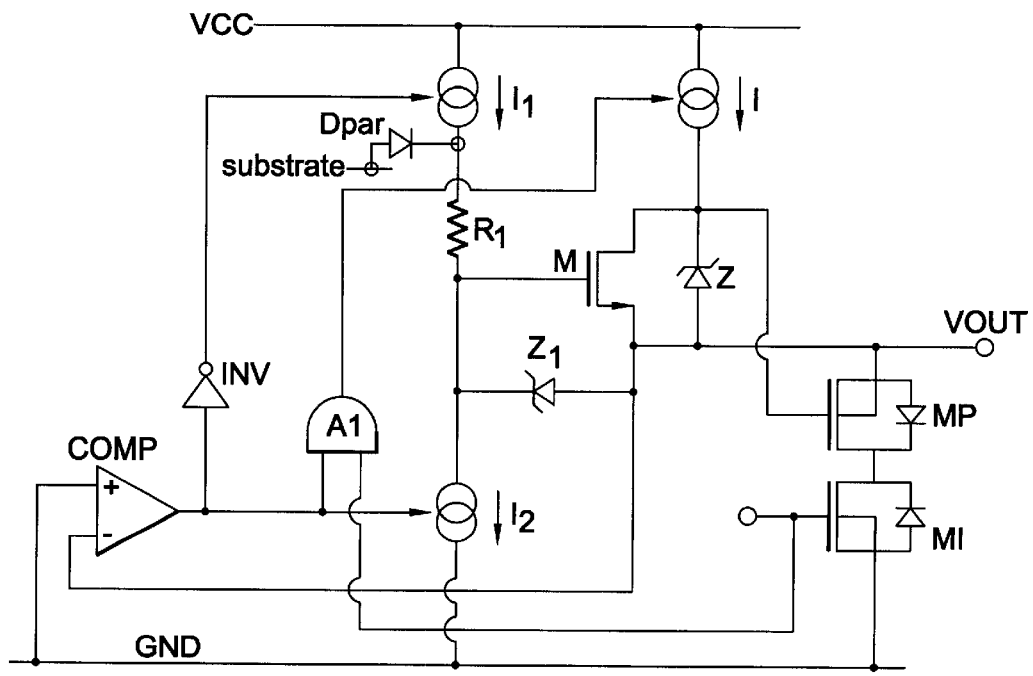
FIG. 5 shows an alternative embodiment of 15 the protection circuit of the invention.

In practice and preferably, both the resistor R and the resistor $R_2$ of the basic scheme of FIG. 4 may be functionally replaced by Zener diodes, as shown in FIG. 5. In this case, during normal functioning conditions, when the MOS transistor M is off, the voltage on its gate node is lower, by a VBE voltage, than the source voltage of the same transistor M. Thus, the MOS transistor M is switched on even faster than in the case of the circuit of FIG. 4, whenever a below ground condition occurs.

Figure 1:
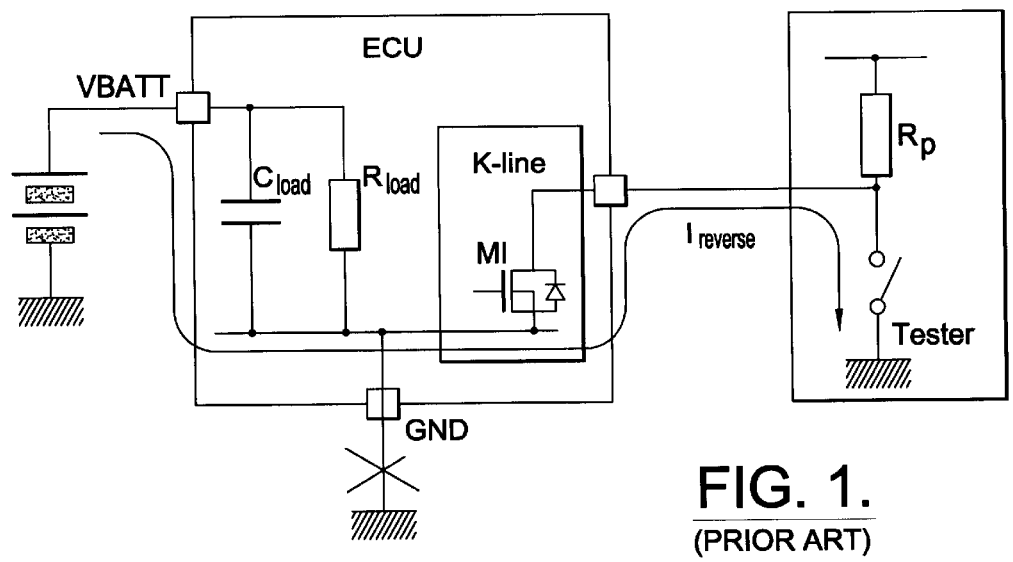
FIG. 1 schematically represents a critical functioning condition of a control unit having a diagnostic line engaged by a testing apparatus, in the prior art and as described above.
Figure 2:
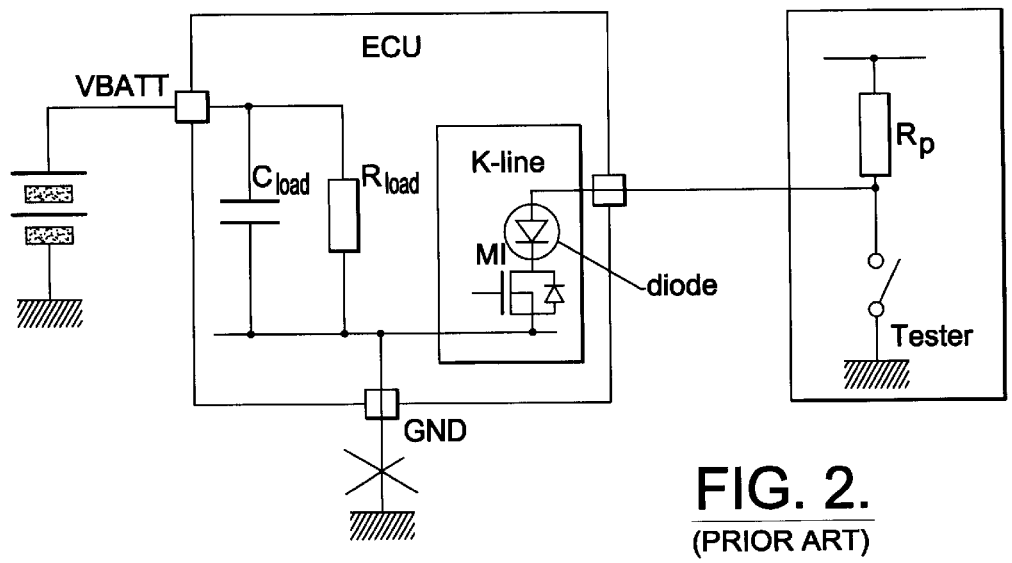
FIG. 2 shows a known circuit of the prior art to protect the interface devices of a diagnostic line output, as described above.
Figure 3:
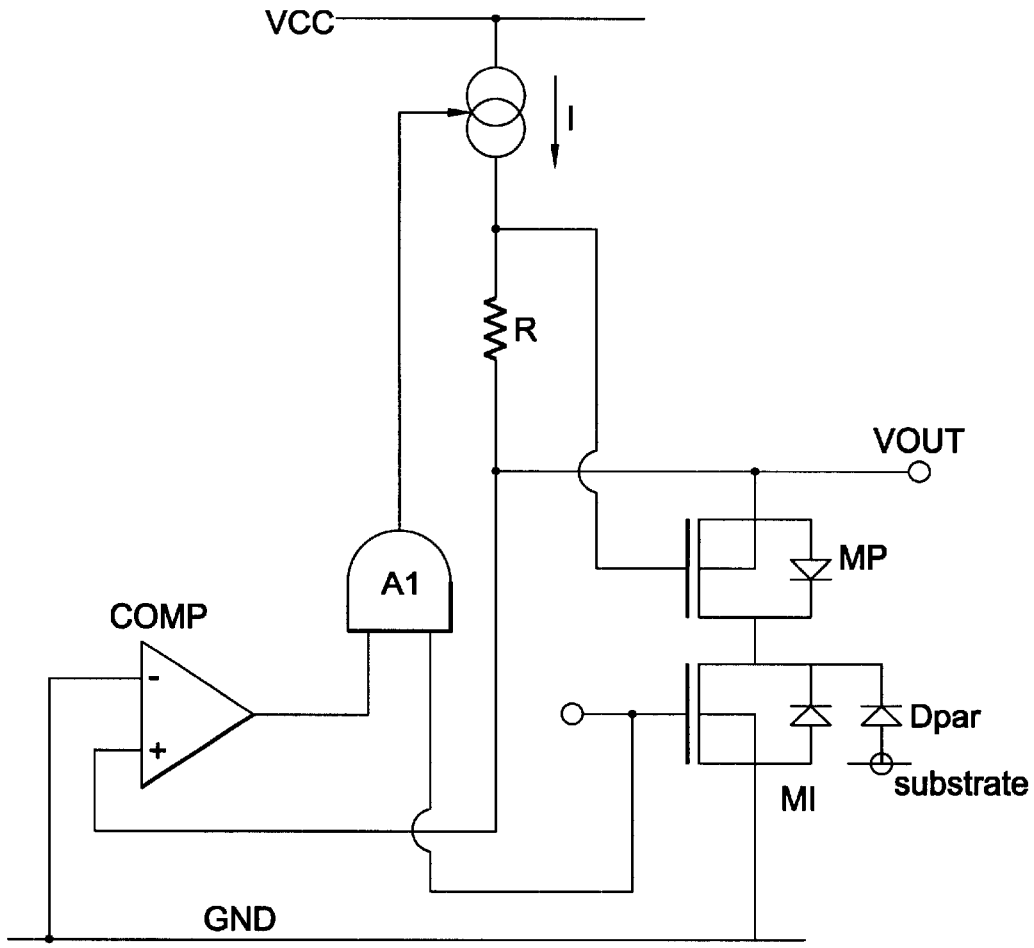
FIG. 3 shows another known circuit of the prior art for protecting the interface devices of a diagnostic line.

The stated goals are thus fulfilled by the protection circuit of the invention because, by comparison with the known circuit of FIG. 3, the circuit of the invention can minimize, to the point of a practically complete elimination, the inverse current flowing through the diagnostic line during a transient (a temporary oscillation that occurs in a circuit because of a sudden change of voltage or of load) when a below ground or ground disconnection condition of the control unit circuits occurs. Also, the invention makes the dimensioning of the interface devices free from the above noted restraints allowing for a minimization of bias current levels.

What is claimed is:

1. A protection circuit for a diagnostic output of control unit for protecting the control unit in the event of a disconnection from ground or a below ground condition, the protection circuit comprising:

first and second transistors, the first transistor having a source connected to ground and a drain connected to the diagnostic output through the second transistor, the second transistor having a source connected to the diagnostic output and a drain connected to the source of the first transistor;

a comparator for comparing a voltage of the diagnostic output with a voltage of a reference node of the control unit;

a logic gate having a first input connected to an output of the comparator and a second input connected to a gate of the first transistor;

a current limiter;

a first current generator connected to the current limiter and defining a connection node therebetween, the connection node connected to a gate of the second transistor, the first current generator being controlled by an output of the logic gate for forcing a current on the diagnostic output via the current limiter;

a third transistor for switching the second transistor off, the third transistor being connected in parallel to the current limiter; and a circuit for controlling the third transistor, the circuit comprising
an inverter,
a voltage divider having an intermediate node,
a second current generator, controlled through inverter by the output of the comparator, for forcing a current, through the voltage divider, on the diagnostic output line, the intermediate node of the voltage divider being connected to a gate of the third transistor; and
a third current generator connected between the intermediate node of the voltage divider and the reference node, controlled by the output of the comparator in phase with the first current generator and in opposite phase from the second current generator.

2. A protection circuit according to claim 1, wherein the current limiter comprises a resistor.

3. A protection circuit according to claim 2, wherein the voltage divider comprises first and second resistors connected together and defining the intermediate node therebetween.

4. A protection circuit according to claim 1, wherein the current limiter comprises a first Zener diode.

5. A protection circuit according to claim 4, wherein the voltage divider comprises a resistor and a second Zener diode connected together and defining the intermediate node therebetween.

6. A protection circuit for protecting a control unit, the control unit including a diagnostic output, the protection circuit comprising:

first and second transistors, the first transistor having a source connected to a reference node and a drain connected to the diagnostic output through the second transistor, the second transistor having a source connected to the diagnostic output and a drain connected to the source of the first transistor;

a third transistor for switching the second transistor off;

a comparator for comparing a voltage of the diagnostic output with a voltage of the reference node of the control unit;

a logic gate having a first input connected to an output of the comparator and a second input connected to a gate of the first transistor;

a current limiter;

a first current generator connected to the current limiter and defining a connection node therebetween, the connection node being connected to a gate of the second transistor, the first current generator being controlled by an output of the logic gate, and connected to the diagnostic output via the current limiter, the third transistor being connected in parallel to the current limiter;

an inverter;

a second current generator;

a voltage divider having an intermediate node; and a third current generator;

the second current generator being connected to the diagnostic output line through the voltage divider, and controlled through the inverter by the output of the comparator, the intermediate node of the voltage divider being connected to the gate of the third transistor to control the third transistor; and the third current generator being connected between the intermediate node of the voltage divider and ground, and controlled by the output of the comparator.

7. A protection circuit according to claim 6, wherein the current limiter comprises a resistor.

8. A protection circuit according to claim 6, wherein the voltage divider comprises first and second resistors connected together and defining the intermediate node therebetween.

9. A protection circuit according to claim 6, wherein the current limiter comprises a first Zener diode.

10. A protection circuit according to claim 9, wherein the voltage divider comprises a resistor and a second Zener diode connected together and defining the intermediate node therebetween.

11. A protection circuit according to claim 6, wherein the reference node is ground.

12. A control unit comprising:

a diagnostic output; and a protection circuit, the protection circuit comprising first, second and third transistors, the first transistor having a source connected to ground and a drain connected to the diagnostic output through the second transistor, the second transistor having a source connected to the diagnostic output and a drain connected to the source of the first transistor, and the third transistor being connected to the second transistor for switching the second transistor off;

wherein the protection circuit further comprises a comparator for comparing a voltage of the diagnostic output with a voltage of a ground node of the control unit, a logic gate having a first input connected to an output of the comparator and a second input connected to a gate of the first transistor, a current limiter, a first current generator connected to the current limiter and defining a connection node therebetween, the connection node being connected to a gate of the second transistor, the first current generator being controlled by an output of the logic gate, and connected to the diagnostic output via the current limiter, the third transistor being connected in parallel to the current limiter, an inverter, a second current generator, a voltage divider having an intermediate node, and a third current generator, the second current generator being connected to the diagnostic output line through the voltage divider, and controlled through the inverter by the output of the comparator, the intermediate node of the voltage divider being connected to the gate of the third transistor to control the third transistor, and the third current generator being connected between the intermediate node of the voltage divider and ground, and controlled by the output of the comparator.

13. A control unit according to claim 12, wherein the current limiter comprises a resistor.

14. A control unit according to claim 12, wherein the voltage divider comprises first and second resistors connected together and defining the intermediate node therebetween.

15. A control unit according to claim 12, wherein the current limiter comprises a first Zener diode.

16. A control unit according to claim 12, wherein the voltage divider comprises a resistor and a second Zener diode connected together and defining the intermediate node therebetween.

17. A method for protecting a diagnostic output of a control circuit, the control circuit including first and second transistors, the first transistor having a source connected to ground and a drain connected to the diagnostic output through the second transistor, the second transistor having a source connected to the diagnostic output and a drain connected to the source of the first transistor; a first current generator connected to the diagnostic output via a current limiter, a connection node between the first current generator and the current limiter being connected to a gate of the second transistor, the method comprising the steps of:

detecting a negative potential or ground disconnection of the control unit by comparing a voltage of the diagnostic output with a voltage of a ground node of the control unit;

generating a control signal based on the comparison;

switching the first current generator off;

generating a current through a voltage divider to the diagnostic output line in response to the control signal; and switching the second transistor off.

18. A method according to claim 17, wherein the current limiter of the control circuit comprises a limiting resistor.

19. A method according to claim 17, wherein the voltage divider comprises first and second resistors.

20. A method according to claim 17, wherein the current limiter of the control circuit is a first Zener diode, and wherein the voltage divider comprises a resistor and a second Zener diode connected together and defining an intermediate node therebetween.

21. A method for protecting a control circuit comprising a diagnostic output, the method comprising:

providing an interface transistor connected to the diagnostic output;

providing a guard transistor connected to the diagnostic output and the interface transistor;

controlling the guard transistor with a MOS transistor for switching the guard transistor off to substantially reduce inverse current to the diagnostic line during a transient;

comparing a voltage of the diagnostic output with a voltage of a ground node of the control circuit;

combining a result of the comparing step with an output of the interface transistor through a logic gate;

generating a first current in response to an output of the logic gate;

limiting the first current;

applying the limited first current to the diagnostic output;

inverting the result of the comparing step to control the generation of a second current; and dividing the voltage of the second current to control the MOS transistor and apply the second current to the diagnostic output.

22. A method according to claim 21, wherein the first current is limited through a resistor.

23. A method according to claim 21, wherein the voltage is divided by first and second resistors.

24. A method according to claim 21, wherein the first current is limited through a first Zener diode.

25. A method according to claim 24, wherein the voltage is divided by a resistor and a second Zener diode.

* * * * *

UNITED STATES PATENT AND TRADEMARK OFFICE
CERTIFICATE OF CORRECTION

PATENT NO. : 6,292,341 B1
DATED : September 18, 2001
INVENTOR(S) : Andrea Milanesi, Stefania Chicca, Marco Morelli and Vanni Poletto It is certified that error appears in the above-identified patent and that said Letters Patent is hereby corrected as shown below:

<u>Title page, Item [54], and Column 1, line 1,</u>
Delete "BIDIRECTIONAL ELECTRONIC SWITCH" insert -- PROTECTION CIRCUIT FOR ELECTRONIC CONTROL UNIT --
Item [75], delete "Milan" insert -- Milano --

<u>Column 1,</u>
Line 23, delete "motor' electronic" insert -- motor's electronic --

<u>Column 2,</u>
Line 24, delete "reducing he resis-" insert -- reducing the resis- --

<u>Column 3,</u>
Line 40, delete "of 15 the" insert -- of the --

Signed and Sealed this

Eleventh Day of June, 2002

*Attest:*

*Attesting Officer*

JAMES E. ROGAN
*Director of the United States Patent and Trademark Office*